(12) United States Patent
Tanaka et al.

(10) Patent No.: US 7,453,333 B2
(45) Date of Patent: Nov. 18, 2008

(54) SURFACE ACOUSTIC WAVE APPARATUS AND COMMUNICATIONS EQUIPMENT

(75) Inventors: Hiroyuki Tanaka, Kyoto (JP); Kiyohiro Iioka, Kyoto (JP)

(73) Assignee: Kyocera Corporation, Kyoto (JP)

( * ) Notice: Subject to any disclaimer, the term of this patent is extended or adjusted under 35 U.S.C. 154(b) by 166 days.

(21) Appl. No.: 11/210,157

(22) Filed: Aug. 23, 2005

(65) Prior Publication Data

US 2006/0044081 A1 Mar. 2, 2006

(30) Foreign Application Priority Data

Aug. 24, 2004 (JP) .............................. 2004-243908

(51) Int. Cl.
*H03H 9/64* (2006.01)

(52) U.S. Cl. .................. 333/195; 333/133; 333/193; 333/194; 333/196; 310/313 R; 310/313 B; 310/313 C; 310/313 D

(58) Field of Classification Search ................ 333/133, 333/193–196; 310/313 R, 313 B, 313 C, 310/313 D See application file for complete search history.

(56) References Cited

U.S. PATENT DOCUMENTS

| | | | | |
|---|---|---|---|---|
| 6,339,365 B1 * | 1/2002 | Kawase et al. | ............... | 333/193 |
| 6,388,545 B1 * | 5/2002 | Kawachi et al. | ............. | 333/193 |
| 6,943,649 B2 * | 9/2005 | Takeda | ........................ | 333/193 |
| 2002/0039056 A1 | 4/2002 | Kawachi et al. | | |
| 2003/0058066 A1 * | 3/2003 | Taniguchi et al. | ............ | 333/193 |
| 2004/0189147 A1 * | 9/2004 | Ito et al. | .................. | 310/313 B |
| 2005/0116352 A1 * | 6/2005 | Warashina et al. | .......... | 257/777 |
| 2005/0146397 A1 * | 7/2005 | Koga et al. | .................. | 333/133 |
| 2005/0264375 A1 * | 12/2005 | Ikuta et al. | ................... | 333/133 |
| 2005/0285699 A1 * | 12/2005 | Yokota et al. | ............... | 333/133 |

FOREIGN PATENT DOCUMENTS

| | | | |
|---|---|---|---|
| JP | 04-293310 | | 10/1992 |
| JP | 2000-049565 | | 2/2000 |
| JP | 2004-235896 | * | 8/2004 |
| JP | 2006014096 A | * | 1/2006 |

\* cited by examiner

*Primary Examiner*—Carl Whitehead, Jr.
*Assistant Examiner*—Malek Maliheh
(74) *Attorney, Agent, or Firm*—Hogan & Hartson LLP

(57) ABSTRACT

A surface acoustic wave apparatus comprises a piezoelectric substrate 17 on the bottom face of which IDT electrodes 3 and 4 and an annular ground electrode 6 which encloses the IDT electrodes 3 and 4 and is connected to the IDT electrode 3, and a base substrate on the top face of which an annular ground conductor 7 is formed and which has an internal ground conductor layer 10a and a bottom face ground conductor layer 11a connected to the annular ground conductor 7 and an internal ground conductor layer 10b and a bottom face ground conductor layer 11b connected to the IDT electrode 4. A first ground conductor composed of the internal ground conductor layer 10a and the bottom face ground conductor layer 11a is electrically separated from a second ground conductor composed of the internal ground conductor layer 10b and the bottom face ground conductor layer 11b. The apparatus has an excellent out-of-band attenuation characteristic.

14 Claims, 10 Drawing Sheets

TOP FACE

FIRST LAYER

INTERNAL GROUND CONDUCTOR LAYER

SECOND LAYER

BOTTOM FACE GROUND CONDUCTOR LAYER

BOTTOM FACE

SURFACE ACOUSTIC WAVE APPARATUS AND COMMUNICATIONS EQUIPMENT

BACKGROUND OF THE INVENTION

1. Field of the Invention

The present invention relates to a surface acoustic wave apparatus and a communications equipment with the surface acoustic wave apparatus, in particular, a surface acoustic wave apparatus with face-down mounting configuration which has an excellent out-of-band attenuation characteristic. This surface acoustic wave apparatus forms circuit components such as a surface acoustic wave filter and a surface acoustic wave resonator. These circuit components are used for communications equipment such as mobile phones.

2. Description Of Related Art

In recent years, as high frequency applications and functional enhancement of the communications equipment have progressed, the demand for a surface acoustic wave filter having the excellent out-of-band attenuation characteristic has increasingly grown.

For example, as a surface acoustic wave filter for mobile phones in the band of 900 MHz, there is a demand for the surface acoustic wave filter having the excellent out-of-band attenuation characteristic in which out-of-band attenuation in the vicinity of a pass band and in the high frequency band of several GHz is increased.

In order to realize such an excellent out-of-band attenuation characteristic, for example, a double-mode surface acoustic wave resonator filter which is provided with three IDT (Inter Digital Transducer) electrodes on a piezoelectric substrate and uses a vertical primary mode and a vertical tertiary mode has been proposed.

FIG. 16 is a schematic plan view showing the configuration of electrodes in a conventional resonator-type surface acoustic wave filter.

An IDT electrode 204 having a plurality of electrode fingers arranged on the piezoelectric substrate is formed of a pair of comb-like electrodes which are opposed to and engaged with each other, and an electric field is applied to the pair of comb-like electrodes, thereby generating a surface acoustic wave.

By inputting an electric signal from an input terminal 215 connected to one comb-like electrode of the IDT electrode 204, the excited surface acoustic wave is propagated to IDT electrodes 203 and 205 arranged at both sides of the IDT electrode 204.

The electric signal is output from one comb-like electrode forming the IDT electrodes 203 and 205, respectively, to output terminals 216 and 217 through IDT electrodes 206 and 209. Reference numerals 210, 211, 212 and 213 in this figure each denote a reflector electrode.

Here, by inputting the electric signal to an input terminal 215, the surface acoustic wave is excited, and the excited surface acoustic wave is propagated to the IDT electrodes 203 and 205 located at both sides of the IDT electrode 204 and to IDT electrodes 207 and 208 sandwiched between the IDT electrode 206 and 209 through the IDT electrodes 206 and 209. Then, the electric signal is output from the output terminals 216 and 217 connected to the IDT electrodes 207 and 208. The surface acoustic wave is reflected by the reflector electrodes 210, 211, 212 and 213 located at both ends and becomes a standing wave between the reflector electrodes 210 and 211 and between the reflector electrodes 212 and 213.

With the above-mentioned two-stage cascade connection of the surface acoustic wave filter having the similar characteristic, the signal attenuated at the first stage can be further attenuated by the second stage, thereby increasing the out-of-band attenuation by about 100%.

To realize the excellent out-of-band attenuation characteristic and reduce insertion loss, the number of stages of the surface acoustic wave filter is preferably two as shown in FIG. 16. In the case of one stage, although insertion loss is small, the out-of-band attenuation is decreased. Conversely, in the case of three or more stages, although the out-of-band attenuation is increased, insertion loss is increased.

Conventionally, the surface acoustic wave device in which such a surface acoustic wave filter is formed is mounted on a package by a face-up mounting method. In this case, by electrically connecting the surface acoustic wave filter to a ground electrode of the package with the use of a bonding wire, a large inductance can be added between the surface acoustic wave filter and the ground electrode, rise of the floor level outside the pass band of the surface acoustic wave filter can be prevented, and the out-of-band attenuation characteristic can be further improved.

On the other hand, to further miniaturize the surface acoustic wave apparatus, a CSP (Chip Scale Package)-type surface acoustic wave apparatus using so-called flip-chip mounting technology in which a conductor bump is used to mount the surface acoustic wave device by the face-down mounting method has been actively developed (refer to Japanese Unexamined Patent Publication No. 2000-49565).

FIG. 17 is a schematic sectional view of the conventional CSP-type surface acoustic wave apparatus.

FIG. 17 shows a piezoelectric substrate 51, a ground pad 52 formed on a bottom face of the piezoelectric substrate 51, an IDT electrode 53 formed on the bottom face of the piezoelectric substrate 51, a ground electrode 54 formed at a package 57, a bump 55 which connects the ground pad 52 to the ground electrode 54, a lid 56 which covers a recessed portion of the package 57 from above and hermetically seals the surface acoustic wave device within the package 57, and a connection layer 58 which connects the package 57 to the lid 56.

As described above, the CSP-type surface acoustic wave apparatus has been developed to improve the out-of-band attenuation characteristic while achieving miniaturization. However, when the CPS-type surface acoustic wave apparatus is produced for the miniaturization of communications equipment, a bonding wire used in the conventional face-up type surface acoustic wave apparatus cannot be used. For this reason, a large inductance cannot be added between the surface acoustic wave filter and the ground electrode (when the inductance is small, an attenuation pole is located at the side of high frequency and thus the attenuation pole cannot contribute to improvement in the filter characteristic) Therefore, there is a problem that the floor level outside the pass band of the surface acoustic wave filter rises and out-of-band attenuation becomes insufficient.

Moreover, the surface acoustic wave apparatus shown in FIG. 17 has the configuration in which the surface acoustic wave device is contained in the package 57 and the top face of the package 57 is hermetically sealed with the lid 56 to prevent oxidization of the IDT electrode 53 and the like. This configuration is disadvantageous to further reduce of the surface acoustic wave apparatus in size and height.

An object of the present invention is to provide a surface acoustic wave apparatus with face-down mounting configuration which is excellent in out-of-band attenuation characteristic and can be reduced in size and height and a communications equipment using the surface acoustic wave apparatus.

SUMMARY OF THE INVENTION

A surface acoustic wave apparatus of the present invention comprises a piezoelectric substrate on the bottom face of which a first IDT electrode, a second IDT electrode and an annular ground electrode which encloses the first IDT electrode and the second IDT electrode and functions as a ground terminal of the first IDT electrode are formed and a base substrate, on the top face of which an annular ground conductor corresponding to the annular ground electrode and a ground pad corresponding to the ground terminal of the second IDT electrode are formed, for mounting the piezoelectric substrate so as to be opposed to the face of the piezoelectric substrate on which the IDT electrode and the like are formed.

The annular ground conductor of the base substrate is connected to a first ground conductor which is formed of at least one of a first internal ground conductor layer and a first bottom face ground conductor layer of the base substrate. The ground pad of the base substrate is connected to a second ground conductor which is formed of at least one of a second internal ground conductor layer and a second bottom face ground conductor layer of the base substrate, and the first ground conductor is electrically separated from the second ground conductor.

In the surface acoustic apparatus of the present invention, since the first ground conductor is electrically separated from the second ground conductor, the signal input to the first IDT electrode can be prevented from propagating to the second IDT electrode through the first ground conductor and the second ground conductor, thereby reducing leakage of signals.

Furthermore, since the first ground conductor contains at least one of the annular ground electrode, the internal ground electrode layer and the bottom face ground conductor layer and the second ground conductor contains at least one of the internal ground electrode layer and the bottom face ground conductor layer, a large inductance can be added between the first IDT electrode and the first ground conductor and between the second IDT electrode and the second ground conductor with capacities formed by each IDT electrode. Thus, since an attenuation pole can be formed at a desired position outside a pass band, rise of the floor level can be suppressed and the out-of-band attenuation characteristic can be improved.

Furthermore, as compared to the configuration in which the first ground conductor is connected to the second ground conductor in parallel, the inductance in each path of the first ground conductor and the second ground conductor becomes larger. As a result, the out-of-band attenuation characteristic can be easily improved.

With the configuration of the present invention, since the piezoelectric substrate can be joined to the base substrate through the annular ground electrode and the annular ground conductor and each of the IDT electrodes can be hermetically sealed, a package conventionally required for hermetic sealing becomes unnecessary and the size and height of the surface acoustic device apparatus can be greatly reduced.

It is preferred that a part of the annular ground conductor, the first internal ground conductor layer and the first bottom face ground conductor layer are arranged to be opposed to each other.

Generally, the position of the attenuation pole outside of the pass band can be controlled by resonance frequency determined by the capacity of each IDT electrode and the inductance of each ground conductor and thus, the desired frequency characteristic can be obtained in the surface acoustic wave apparatus.

With the configuration of the present invention, a part of the annular ground conductor is opposed to the internal ground conductor layer and the bottom face ground conductor layer, the position of the attenuation pole can be further controlled by the capacity generated between the annular ground conductor and at least one of the opposed internal ground conductor layer and the bottom face ground conductor layer in addition to the capacity of the first IDT electrode and the inductance of the first ground conductor. As a result, since the frequency range in which the position of the attenuation pole outside the pass band can be controlled can be extended to the side of low frequency so as to get closer to the pass band, the desired filter characteristic can be obtained.

For similar reasons, it is preferred that the second internal ground conductor layer and the second bottom face ground conductor layer are arranged to be opposed to each other.

It is preferred that the base substrate has four or more corner portions viewed in a plan view and the first bottom face ground conductor layer is provided at one of two corner portions which are not adjacent to each other and the second bottom face ground conductor layer is provided at the other of the two corner portions which are not adjacent to each other. With this configuration, since the distance between the signal terminal of the first IDT electrode and the signal terminal of the second IDT electrode can be made longer without enlarging the surface acoustic wave apparatus, interference between the signal terminals can be reduced as much as possible, thereby realizing the compact surface acoustic wave apparatus with good isolation between the signal terminals.

In the surface acoustic wave apparatus of the present invention, it is preferred that the signal terminal of the first IDT electrode and the signal terminal of the second IDT electrode are led to the bottom face of the base substrate through a first signal conductor and a second signal conductor formed on the base substrate, respectively, and the first internal ground conductor layer or the second internal ground conductor layer is arranged between the first signal terminal and the second signal terminal. With this configuration, electromagnetic coupling between the signal terminal of the first IDT electrode and the signal terminal of the second IDT electrode can be weakened without enlarging the surface acoustic wave apparatus, interference between the signal terminals can be reduced as much as possible, thereby realizing the compact surface acoustic wave apparatus with good isolation between the signal terminals.

The base substrate is a multilayer substrate, the annular ground conductor may be connected to the first internal ground conductor layer via a through conductor and the first internal ground conductor layer may be connected to the first bottom face ground conductor layer via the through conductor.

The base substrate is a multilayer substrate, the ground pad formed on the top face of the base substrate may be connected to the second internal ground conductor layer via the through conductor and the second internal ground conductor layer may be connected to the second bottom face ground conductor layer via the through conductor.

With such a configuration, by the annular ground conductor, the ground pad, the through conductor, the internal ground conductor layer and the bottom face ground conductor layer, much larger inductance and capacity can be added between each IDT electrode on the piezoelectric substrate and the corresponding bottom face ground conductor of the base substrate. As a result, since the frequency range in which the position of the attenuation pole outside the pass band can be controlled can be extended to the side of low frequency so as to get closer to the pass band, the out-of-band attenuation characteristic in the desired frequency range can be further improved.

Since the communications equipment of the present invention has at least one of a receiving circuit and a transmitting circuit using the surface acoustic wave apparatus of the present invention as a high frequency filter, reduction in size and height is possible and remarkably good radiation spurious characteristics and receiving sensitivity as communications equipment can be achieved.

The above-mentioned and other advantages, features and effects will appear more fully hereinafter from a consideration of the following description of an embodiment with reference to the accompanying drawings.

BRIEF DESCRIPTION OF THE DRAWINGS

In the drawings described below, the size of each electrode, the distance between electrodes, the number of electrode fingers and the distance between electrode fingers are schematically shown for illustrative purposes.

DETAILED DESCRIPTION OF PREFERRED EMBODIMENTS

Figure 1:
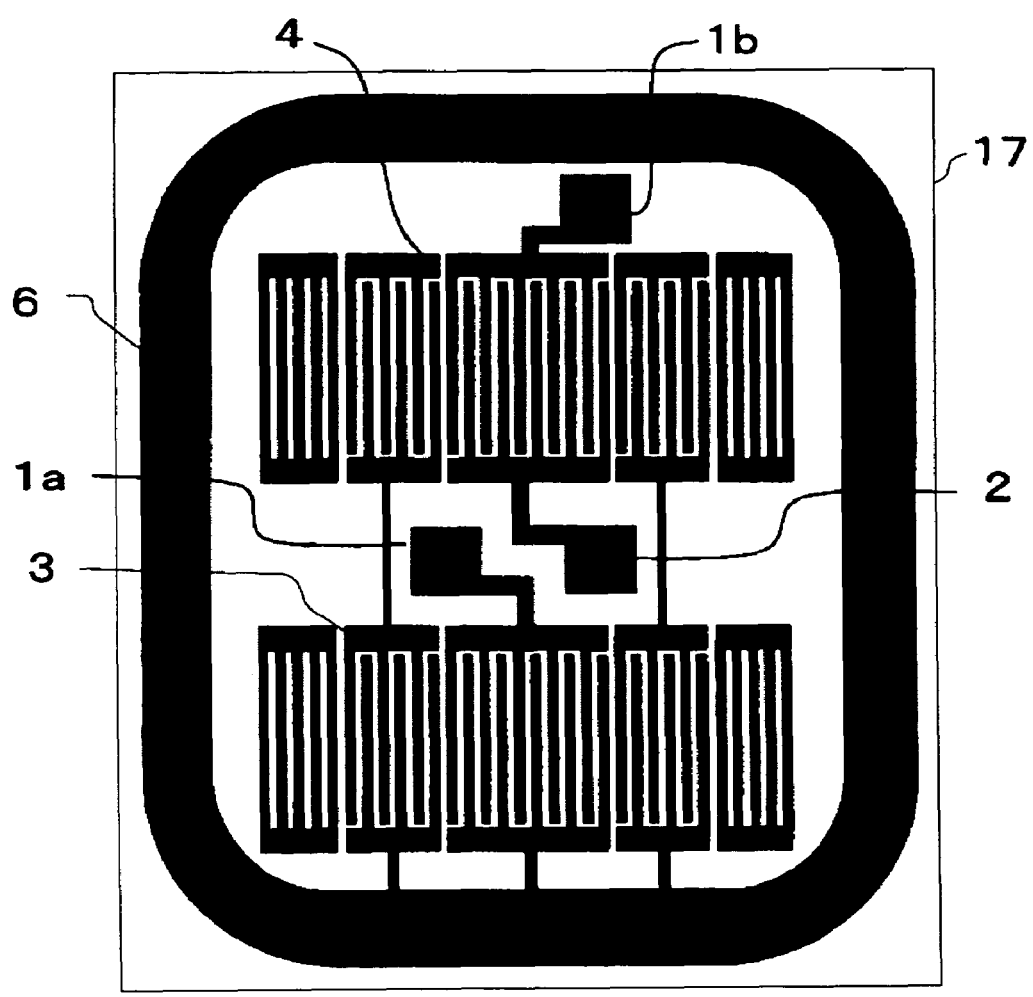
FIG. 1 is a plan view showing an example of the arrangement of electrodes of a surface acoustic wave device which forms a surface acoustic wave apparatus of the present invention.

FIG. 1 is a plan view showing an example of arrangement of electrodes of an surface acoustic wave device which forms a surface acoustic wave apparatus of the present invention.

In this surface acoustic wave device, a first IDT electrode 3, a second IDT electrode 4 and an annular ground electrode 6 which encloses these IDT electrodes 3 and 4 are formed on a bottom face of a piezoelectric substrate 17.

The first IDT electrode 3 and the second IDT electrode 4 each are formed of a pair of comb-like electrodes and one electrode of the first IDT electrode 3 and one electrode of the second IDT electrode 4 are connected to signal terminals 1a and 1b, respectively.

The other electrode of the first IDT electrode 3 is connected to the annular ground electrode 6 which functions as a ground terminal and the other electrode of the second IDT electrode 4 is connected to a ground terminal 2.

The first IDT electrode 3 and the second IDT electrode 4 are connected to each other so as to be a double-mode resonator-type surface acoustic wave filter.

Here, although the number of the electrode fingers of each of the IDT electrodes 3 and 4 may range from a few to several hundred, the shape of the electrode fingers is simplified in the figure. The signal terminals 1a and 1b and the ground terminal 2 can be arranged at any positions in a region enclosed by the annular ground electrode 6 on the bottom face of the piezoelectric substrate 17, which are not limited to the positions in the figure. Furthermore, the configuration of the electrodes in the surface acoustic wave device of FIG. 1 is not limited to the illustrated mode and the IDT electrodes as surface acoustic wave resonators can be formed in a further multistage configuration.

Figure 2:
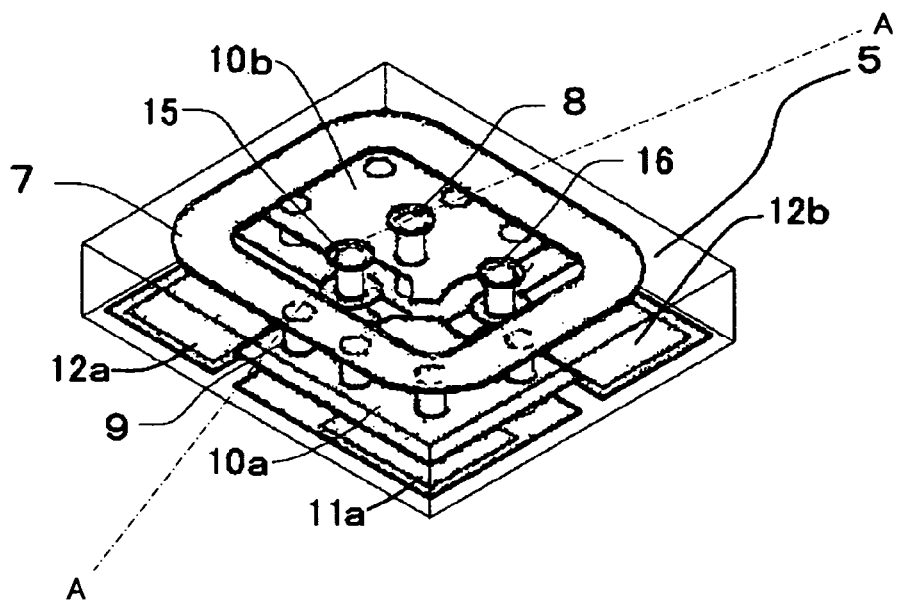
FIG. 2 is a perspective view of an example of the configuration of a base substrate on which the surface acoustic wave device is mounted.
Figure 3:
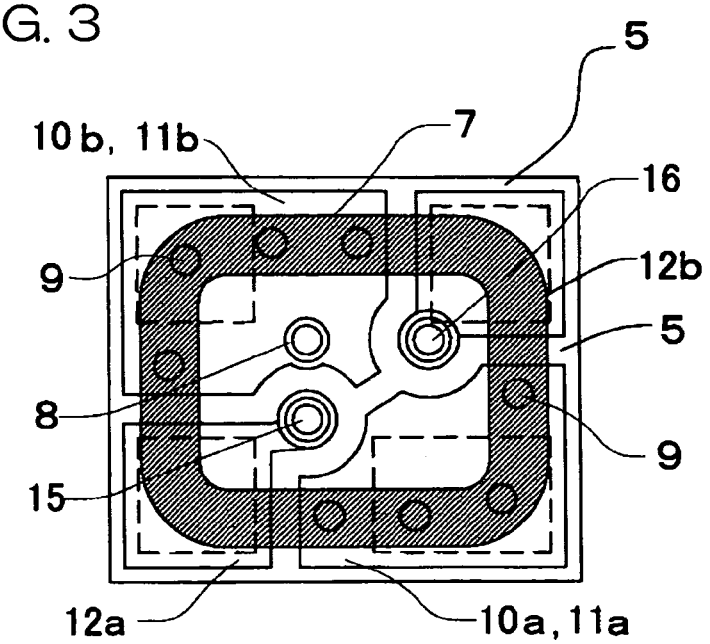
FIG. 3 is a plan view of the base substrate shown in FIG. 2.

FIG. 2 is a perspective view of a base substrate 5 for mounting the surface acoustic wave device thereon. FIG. 3 is a perspective plan view of the base substrate 5 shown in FIG. 2.

Figure 4A:
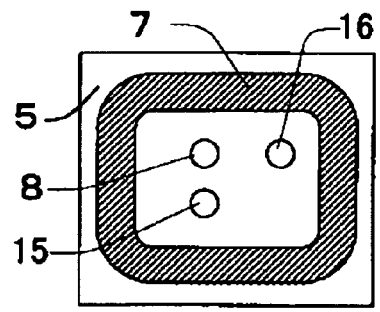
FIG. 4(a) to FIG. 4(f) each is a plan view of each layer forming the base substrate shown in FIG. 2.
Figure 4B:
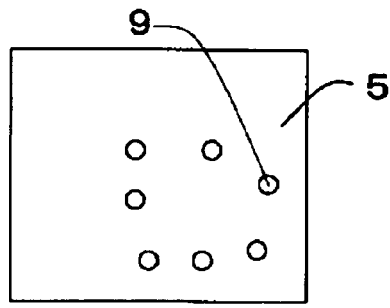
Figure 4C:
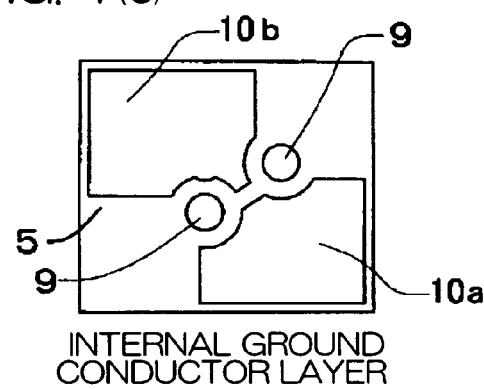
Figure 4D:
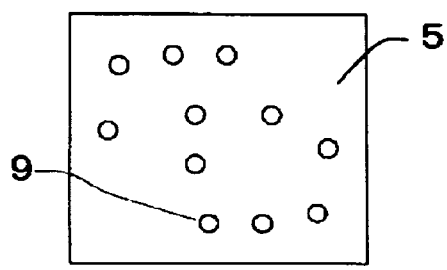
Figure 4E:
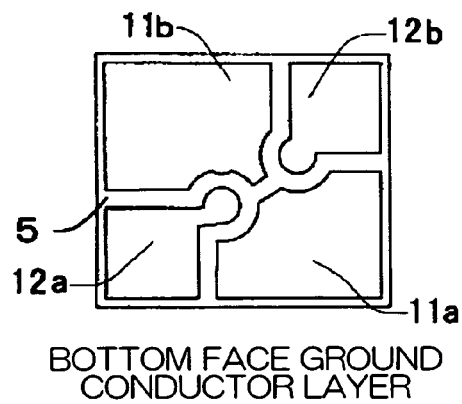
Figure 4F:
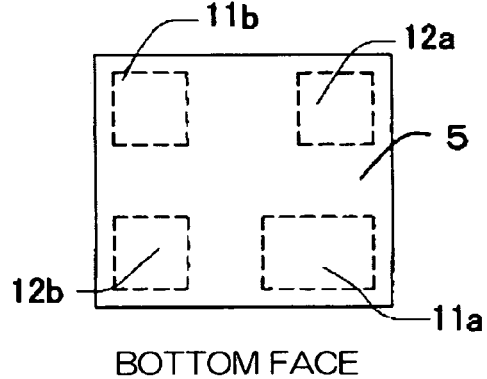

FIGS. 4(a) to 4(f) each are a plan view of each layer forming the base substrate 5 shown in FIG. 2. FIG. 4(f) is a bottom view and broken line portions indicate that a conductor layer on the bottom face is exposed.

The base substrate 5 is formed of a dielectric multilayer substrate.

As shown in FIG. 2, FIG. 3 and FIG. 4(a), an annular ground conductor 7 corresponding to the annular ground electrode 6, a first signal pad 15 and a second signal pad 16 which correspond to the signal terminals 1a of the first IDT electrode 3 and the signal terminal 1b of the second IDT electrode 4, respectively, and a ground pad 8 corresponding to the ground terminal 2 are formed on a top face of the base substrate 5. On the first signal pad 15, the second signal pad 16, the ground pad 8 and the annular ground conductor 7, a joint layer 20 for connecting these components to the corresponding signal terminals 1a and 1b, the ground terminal 2 and the annular ground electrode 6 of the surface acoustic wave device is formed.

Figure 5:
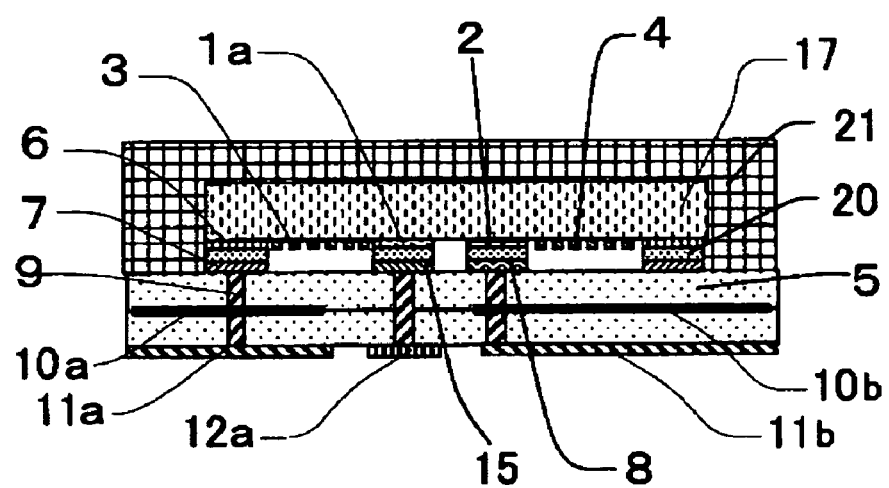
FIG. 5 is a sectional view of the base substrate shown in FIG. 2.

FIG. 5 is the sectional view showing the state where the surface acoustic wave device is mounted on the base substrate 5 shown in FIG. 2 take along a line A-A.

As shown in FIG. 5 and FIG. 4(a) to FIG. 4(f), the signal terminal 1a of the first IDT electrode 3, the ground terminal 2 of the second IDT electrode 4 and the annular ground electrode 6 in the surface acoustic wave device each are connected to the first signal pad 15, the ground pad 8 and the annular ground conductor 7, respectively, via the joint layer 20. Although not shown in FIG. 5, similarly, the signal terminal 1b of the second IDT electrode 4 is connected to the second signal pad 16 via the joint layer 20.

The first signal pad 15 connected to the signal terminal 1a of the first IDT electrode 3 is connected to a signal pattern 12a formed on the bottom face of the base substrate 5 via a through conductor 9. This conductor path is called a "first signal conductor".

The second signal pad 16 connected to the signal terminal 1b of the second IDT electrode 4 is connected to a signal pattern 12b formed on the bottom face of the base substrate 5 via the through conductor 9. This conductor path is called a "second signal conductor".

The annular ground conductor 7 is connected to an internal ground conductor layer 10a and a bottom face ground conductor layer 11a via the through conductor 9. A conductor path containing the annular ground conductor 7, the internal ground conductor layer 10a and the bottom face ground conductor layer 11a is called a "first ground conductor". As shown in FIG. 4(e), when the base substrate 5 is viewed in a plan view, the first ground conductor is arranged between the first signal conductor and the second signal conductor.

On the base substrate 5, the ground pad 8 is connected to an internal ground conductor layer 10b and a bottom face ground conductor layer 11b. A conductor path containing the internal ground conductor layer 10b and the bottom face ground conductor layer 11b is called a "second ground conductor". As shown in FIG. 4(e), when the base substrate 5 is viewed in a plan view, the second ground conductor is arranged between the first signal conductor and the second signal conductor.

A feature of the present invention is that the second ground conductor is electrically separated from the first ground conductor.

The above-mentioned surface acoustic wave device is mounted on the base substrate 5 so that a bottom face of the piezoelectric substrate 17 is opposed to the top face of the base substrate 5. A sealing resin 21 is formed by the potting method or the printing method so as to cover the surface acoustic wave device on the base substrate 5 to produce the surface acoustic wave apparatus of the present invention.

Thus, since the first IDT electrode 3 and the second IDT electrode 4 can be hermetically sealed by joining the annular ground electrode 6 and the annular ground conductor 7 via the joint layer 20, a package conventionally required for hermetic sealing becomes unnecessary and therefore, the size and height of the surface acoustic wave apparatus can be reduced.

In the surface acoustic wave apparatus of the present invention, since electromagnetic coupling can be prevented by such a configuration that the second ground conductor is electrically separated from the first ground conductor, the signal input to the first IDT electrode 3 can be prevented from propagating to the second IDT electrode 4 through the first ground conductor and the second ground conductor and therefore, the compact surface acoustic device with good isolation between the signal terminals can be realized.

In the base substrate 5, the annular ground conductor 7 is connected to the internal ground conductor layer 10a via the through conductor 9, the internal ground conductor layer 10a is connected to the bottom face ground conductor layer 11a via the through conductor 9, the ground pad 8 formed on the top face of the base substrate 5 is connected to the internal ground conductor layer 10b via the through conductor 9 and the internal ground conductor layer 10b is connected to the bottom face ground conductor layer 11b via the through conductor 9. Therefore, large enough inductance and capacity between each of the IDT electrodes 3 and 4 on the piezoelectric substrate 17 and the corresponding bottom face ground conductor layers 11a and 11b of the base substrate 5 can be added without making the surface acoustic wave apparatus larger. Thus, an attenuation pole can be formed at a desired position outside of a pass band. Thus, since rise of the floor level can be suppressed, the out-of-band attenuation characteristic can be improved.

Especially since the first ground conductor is electrically separated from the second ground conductor, the inductance in the path of the first ground conductor and the inductance in the path of the second ground conductor become larger as compared to the case where the first ground conductor and the second ground conductor are connected in parallel. As a result, the out-of-band attenuation characteristic of the high-frequency filter can be improved.

Generally, the position of the attenuation pole outside the pass-band is controlled by the resonance frequency determined depending on the capacity of each of the IDT electrodes 3 and 4 and the inductance of each ground conductor. Whereby, the desired frequency characteristic in the surface acoustic wave apparatus can be obtained.

With the configuration of the present invention shown in FIG. 1 to FIG. 5, since a part of the annular ground conductor 7 is opposed to the internal ground conductor layer 10a and the bottom face ground conductor layer 11a, the position of the attenuation pole can be further controlled by the capacity generated between the annular ground conductor 7 and at least one of the opposed internal ground electrode layer 10a and the bottom face ground conductor layer 11a, in addition to the capacity of the first IDT electrode 3 and the inductance of the first ground conductor. As a result, since the frequency range in which the attenuation pole outside the pass band can be controlled can be further extended to the side of low frequency so as to get closer to the pass band, the desired filter characteristic can be acquired.

Furthermore, it becomes unnecessary to form the ground terminal of the first IDT electrode 3 by assigning the function of the ground terminal of first IDT electrode 3 to the annular ground electrode 6, the surface acoustic wave apparatus can be reduced in size by a gap formed between the ground terminal and the annular ground electrode 6 when the ground terminal is independently formed.

Next, a modification of the internal configuration of the base substrate 5 will be described using FIG. 6 to FIG. 8.

Figure 6:
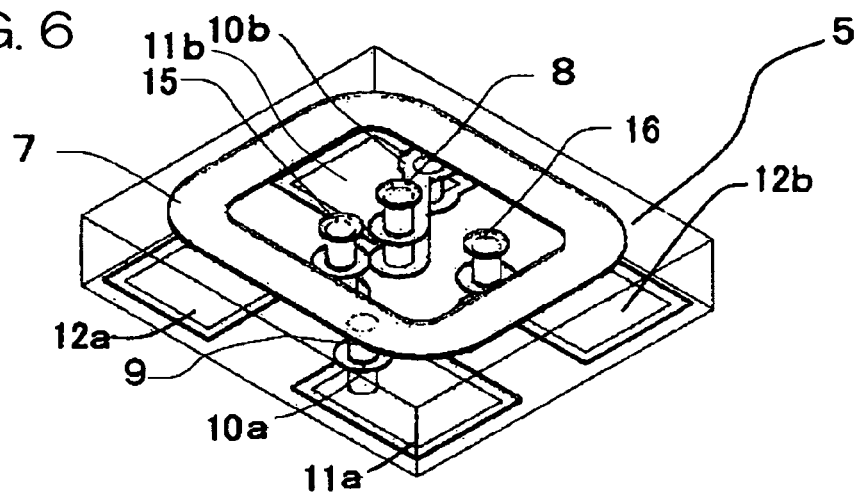
FIG. 6 is a perspective view of another example showing the configuration of the base substrate.

For example, with the configuration shown in FIG. 6, as compared to the configuration shown in FIG. 2, the size of the internal ground conductor layers 10a and 10b becomes smaller, the number of the through conductors 9 which connect the internal ground conductor layer 10a and the bottom face ground conductor layer 11a becomes smaller and the number of through conductors 9 which connect the internal ground conductor layer 10b and the bottom face ground conductor layer 11b becomes smaller.

Figure 7:
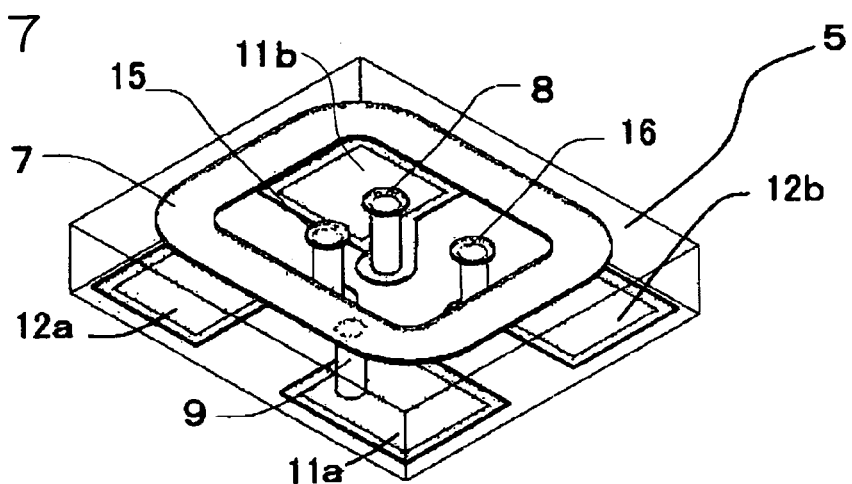
FIG. 7 is a perspective view of another example showing the configuration of the base substrate.

As compared to the configuration shown in FIG. 2, the internal ground conductor layers 10a and 10b are omitted in the configuration shown in FIG. 7.

With the configuration shown in FIG. 6 and FIG. 7, like the configuration shown in FIG. 2, the base substrate 5 has four or more corner portions in a plan view, the bottom face ground conductor layer 11a of the first ground conductor is provided at one of two corner parts which are not adjacent to each other of these corner parts and the bottom face ground conductor layer 11b of the second ground conductor is provided at the other of two corner parts which are not adjacent to each other. Thus, since the distance between the signal terminal 1a of the first IDT electrode 3 and the signal terminal 1b of the second IDT electrode 4 can be increased without making the surface acoustic wave apparatus larger, interference between the signal terminals 1a and 1b can be reduced as much as possible, thereby realizing a compact surface acoustic wave apparatus with good isolation between the signal terminals.

Figure 8:
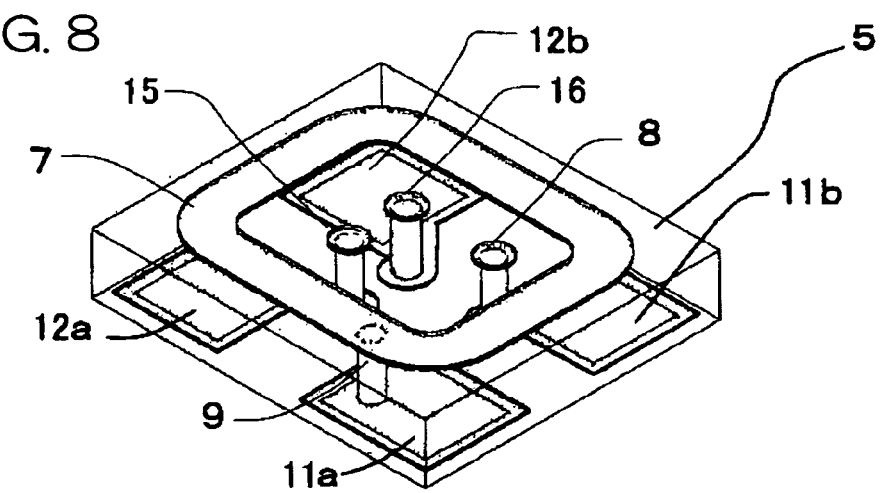
FIG. 8 is a perspective view of another example showing the configuration of the base substrate.

In FIG. 8, the bottom face ground conductor layer 11a of the first ground conductor and the bottom face ground conductor layer 11b of the second ground conductor are arranged at two corner parts which are adjacent to each other when the base substrate 5 is viewed in a plan view. Also in this case, it is possible to electrically separate the second ground conductor from the first ground conductor. With this configuration, since electromagnetic coupling between the first ground conductor and the second ground conductor can be suppressed, the signal input to the first IDT electrode 3 can be prevented from propagating to the second IDT electrode 4 through the first ground conductor and the second ground conductor, thereby realizing a compact surface acoustic wave apparatus with good isolation between the signal terminals.

Furthermore, since the piezoelectric substrate 2 can be joined to the base substrate 5 with the annular ground electrode 6 and the annular ground conductor 7 and each of the IDT electrodes 3 and 4 can be hermetically sealed, the package conventionally required for hermetic sealing becomes unnecessary and the size and length of the surface acoustic wave apparatus can be greatly reduced.

Figure 9:
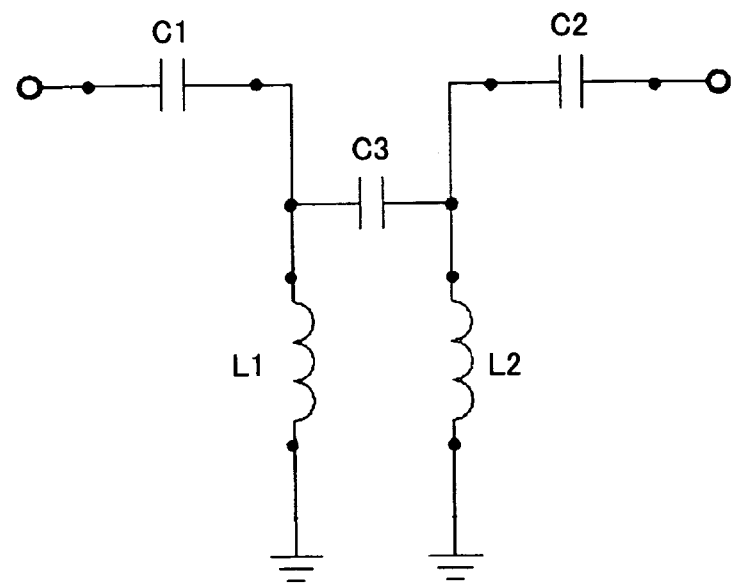
FIG. 9 is a simplified circuit diagram of the surface acoustic wave apparatus.

FIG. 9 is a simplified circuit diagram of the surface acoustic wave apparatus of the present invention.

C1 and C2 represent the capacities of the electrode fingers of the IDT electrodes 3 and 4. L1 and L2 represent the inductances between IDT electrodes 3 and 4 and the bottom face ground conductor layers 11a and 11b, respectively.

As shown in FIG. 9, the resonance frequency can be controlled by the capacities C1, C2 and the inductances L1, L2, and desired frequency characteristics can be obtained by controlling the attenuation pole.

Moreover, since the annular ground conductor 7 is opposed to at least one of the internal ground conductor layer 10a and the bottom face ground conductor layer 11a and the internal ground conductor layer 10b is opposed to the bottom face ground conductor layer 11b in the surface acoustic wave apparatus of the present invention, capacity components occur also between these conductors 7, 10a, 10b, 11a and 11b.

A capacity component formed between the first ground conductor and the second ground conductor among the capacity components is expressed as C3.

By controlling the capacities C1, C2, the inductances L1, L2 and the capacity C3 generated between the first ground conductor and the second ground conductor, the position of the attenuation pole can be controlled more accurately and the out-of-band attenuation characteristic can be greatly improved.

Since miniaturization of the surface acoustic wave apparatus has recently progressed, there is a limit in the magnitude of the inductances L1 and L2.

Then, by providing the internal ground conductor layers 10a and 10b and the bottom face ground conductor layers 11a and 11b which are opposed to the annular ground conductor 7, capacity components are generated between the annular ground conductor 7, the internal ground conductor layers 10a and 10b and the bottom face ground conductor layer 11a and 11b, so that the attenuation pole can be provided at a desired position over a larger frequency range.

The magnitude of these capacity components can be controlled by the area and distance of the opposed conductors 7, 10a, 10b, 11a and 11b. The first ground conductor is connected to the second ground conductor through the capacity component C3 by arranging the conductors 7, 10a, 10b, 11a, and 11b so as to be opposed to each other. However, since the conductors are not connected through the inductance, there is little possibility that a signal leaks from the signal terminal 1a at the side of input to the signal terminal 1b at the side of output through the first ground conductor and the second ground conductor.

Next, a producing method of the surface acoustic wave apparatus of the present invention will be described.

36°±3° Y-cut X-propagating lithium tantalate single crystal, 42°+3° Y-cut X-propagating lithium tantalate single crystal, 64°±3° Y-cut X-propagating lithium niobate single crystal, 41°+3° Y-cut X-propagating lithium single crystal or 45°±3° X-cut Z-propagating lithium tetoraborate single crystal is preferably used as the piezoelectric substrate 17 for the surface acoustic wave filter because of its large electromechanical coupling coefficient and small frequency temperature coefficient. Although these piezoelectric single crystals have pyroelectricity, any substrate pyroelectricity of which is greatly deteriorated by making oxygen defect or dissolving Fe or the like is suitable in terms of reliability of the device.

The thickness of the piezoelectric substrate 17 is preferably 0.1 mm to 0.5 mm. The piezoelectric substrate having a thickness less than 0.1 mm is fragile and the piezoelectric substrate having a thickness more than 0.5 mm results in increase in material costs and component size.

The IDT electrodes 3 and 4 and the annular ground electrode 6 are made of Al or Al alloy (Al—Cu alloy and Al—Ti alloy) and formed by a thin film forming method such as the evaporation method, the sputtering method or the CVD method. It is preferable that the thickness of the electrode is 0.1 µm to 0.5 µm to obtain characteristics of the surface acoustic wave filter.

Furthermore, by forming a protective film made of $SiO_2$, $SiN_x$, Si or $Al_2O_3$ on the surface acoustic wave propagation part such as the first IDT electrode 3 and the second IDT electrode 4 on the piezoelectric substrate 17, short circuit due to adhesion of conductive foreign substances can be prevented and frequency can also be adjusted. The protective film may be formed by a normal thin film formation method such as the evaporation method or the sputtering method after the first IDT electrode 3 and the second IDT electrode 4 are formed.

On the other hand, the base substrate 5 is a body made of insulating material in which a plurality of insulating layers are laminated. Ceramics and glass ceramics are used for these insulating layers. After a green sheet is produced by molding a slurry obtained by uniformly kneading a metal oxide such as ceramics and an organic binder with an organic solvent or the like in the shape of a sheet and desired conductor patterns 7, 8, 10a, 10b, 11a, 11b, 12, 15 and 16 and a pattern (via hole) of the through conductor 9 are formed and then integrally molded and baked by laminating and crimping the green sheet.

For the annular ground conductor 7, the ground pad 8, the first signal pad 15, the second signal pad 16, the internal ground conductor layers 10a and 10b and the bottom face ground conductor layers 11a and 11b, metal conductors such as Au, Cu, Ag, Ag—Pd and W are formed by the combination of a film formation method and etching or conductor layers formed by laminating W, Ni and Au from the bottom to the top are formed to desired patterns by the electrolysis plating method or the non-electrolyzed plating method.

The through conductor 9 is a conductor made of Ag, for example, and may be formed as follows: a through hole (via hole) is formed at a desired position of the green sheet by micro drilling, punching, laser processing, mold stamping, photolithography or the like and then filled with a conductor paste such as Ag.

The joint layer 20 is formed by forming a soldering paste, an Au—Sn solder paste or the like by a printing method such as screen printing or applying the paste with a dispenser. Although the joint layer 20 is formed at the side of the base substrate 5 here, it may be formed at the side of the surface acoustic wave device.

Space hermetically sealed with the annular ground electrode 6 and annular ground conductor 7 (hereinafter referred to as enclosed space) may be filled and sealed with inert gas such as air with low humidity, nitrogen gas or argon gas. This can advantageously prevent deterioration of the first IDT electrode 3 and the second IDT electrode 4 due to oxidation.

A sealing resin 21 is provided to prevent invasion of humid air to the enclosed space and enhance the mechanical intensity of the surface acoustic wave apparatus. For example, thermosetting resin such as epoxy resin and polyimide resin, thermoplastic resin such as polyphenylene sulfide resin, ultraviolet curing resin or low-melting glass can be used as a material for the sealing resin 21 and the material is applied by a potting method or printing method and then hardened to form the sealing resin.

The surface acoustic wave apparatus of the present invention can be applied to a communications equipment.

The communications equipment comprises at least one of a receiving circuit and a transmitting circuit and adopts the surface acoustic wave apparatus of the present invention as a band-pass filter contained in the circuits.

For example, a transmitting signal output from the transmitting circuit is impressed on the career frequency by a mixer, an unnecessary signal is attenuated by the band-pass filter. Then, the transmitting signal is amplified by a power amplifier and transmitted from an antenna through a duplexer. When the surface acoustic wave apparatus of the present invention is adopted in the communications equipment with such a transmitting circuit, the excellent communications equipment having a few spurious signals can be offered.

A receiving signal is received by the antenna and the receiving signal passing through the duplexer is amplified by a low-noise amplifier. Then, an unnecessary signal is attenuated by the band-pass filter, the signal is separated from the career frequency by the mixer and the signal is taken out. When the surface acoustic wave apparatus of the present invention is adopted in the communications equipment with such a receiving circuit, the communications equipment which is excellent in sensitivity can be offered.

Although the surface acoustic wave filter is taken as an example of the surface acoustic wave apparatus in the above-mentioned Description of Preferred Embodiment, the surface acoustic wave apparatus of the present invention can be suitably applied to the surface acoustic wave resonator. Furthermore, in the other configuration, it is possible to make modifications as necessary without deviating from the contents of the present invention. For example, two or more pairs of the IDT electrodes having a different pass band may be provided in the region surrounded by the annular ground electrode 6.

FIRST EXAMPLE

An example of producing the surface acoustic wave apparatus shown in FIG. 1 to FIG. 5 as a trial will be described in detail.

First, the surface acoustic wave device shown in FIG. 1 was formed. That is, fine patterns of the signal terminals 1a and 1b, the ground terminal 2, the first IDT electrode 3, the second IDT electrode 4 and the annular ground electrode 6 were formed on the piezoelectric substrate 17 of 38.7° Y-cut X-propagating LiTaO$_3$ single crystal by using Al (99 percent by mass)-Cu (1 percent by mass).

Here, one electrode of the electrode pair forming the first IDT electrode 3 was connected to the signal terminal 1a formed between the first IDT electrode 3 and the second IDT electrode 4 and the other electrode of the electrode pair was connected to the annular ground electrode 6 which functions as the ground terminal. One electrode of the electrode pair forming the second IDT electrode 4 was connected to the ground terminal 2 formed between the first IDT electrode 3 and the second IDT electrode 4 and the other electrode of the electrode pair was connected to the signal terminal 1b formed between the second IDT electrode 4 and the annular ground electrode 6.

The patterns were prepared by photo lithography using a sputtering instrument, a reduction projection aligner (stepper) and a RIE (Reactive Ion Etching) equipment.

First, the piezoelectric substrate 17 was subjected to ultrasonic washing with acetone, IPA (isopropyl alcohol) or the like to remove organic constituents. Next, the piezoelectric substrate 17 was fully dried in a clean oven and then each of the electrodes 3, 4 and 6 and the terminals 1a, 1b and 2 was deposited. For deposition of the electrodes 3, 4 and 6 and the terminals 1a, 1b and 2, a material formed of an Al (99 percent by mass)-Cu (1 percent by mass) alloy was formed so as to be about 0.30 μm in thickness by using the sputtering instrument.

Subsequently, a photoresist was formed to be about 0.5 μm in thickness by spin-coating and patterned in a desired shape by the reduction projection aligner (stepper), and an unnecessary portion of the photoresist was dissolved with an alkali developing solution in a development device to expose a desired pattern. Then, the electrode film was etched with the RIE equipment to obtain the pattern of each of the electrodes 3 and 4 and the terminals 1a, 1b and 2 of the surface acoustic wave device forming the surface acoustic wave filter.

After that, a protective film was produced on the region in which the electrodes 3, 4 and 6 and the terminals 1a, 1b and 2 were formed. That is, SiO$_2$ was formed on the electrodes 3, 4 and 6, the terminals 1a, 1b and 2 and the piezoelectric substrate 17 to be about 0.02 μm in thickness by using a CVD (Chemical Vapor Deposition) equipment. Then, the photoresist was patterned by photolithography and a window part for flip chip was etched at the formation position of each of the terminals 1a, 1b and 2 and the annular ground electrode 6 with the RIE equipment and the like. Then, using the sputtering instrument, a layer made of Al was deposited to be about 1.0 μm in thickness. Subsequently, Al and the photoresist in the parts except for the formation position of each of the terminals 1a, 1b and 2 and the annular ground electrode 6 were simultaneously removed by the lift-off method and a pad for flip chip was completed on the terminals 1a, 1b and 2 and the annular ground electrode 6.

Next, the joint layer 20 for flip chip formed by solder was formed on the pad using the screen printing device. The diameter and height of the joint layer 20 on the terminals 1a, 1b and 2 were about 80 μm and about 30 μm, respectively. The height of the joint layer 20 on the annular ground electrode 6 was about 30 μm.

Next, the piezoelectric substrate 17 was subjected to dicing processing along a dicing line and divided into individual surface acoustic wave devices.

Next, the base substrate 5 shown in FIG. 2 to FIG. 4 was produced. That is, for preparing LTCC (Low temperature Co-fired Ceramics), a green sheet was produced by molding a slurry obtained by uniformly kneading a metal oxide and an organic binder with an organic solvent or the like in the shape of a sheet, and the patterns of the annular ground conductor 7, the ground pad 8, the first signal pad 15, the second signal pad 16, the internal ground conductor layer 10, the bottom face ground conductor layer 11, the signal pattern 12 and the pattern of the through conductor 9 were formed at desired positions, and then integrally molded and baked by laminating and crimping the green sheet. The size of the base substrate 5 was a 2.5×2.0 mm square.

Here, the annular ground conductor 7, the ground pad 8, the first signal pad 15, the second signal pad 16, the internal ground conductor layer 10, the bottom face ground conductor layer 11 and the signal pattern 12 were formed of Ag to be about 1 μm so as to correspond to the signal terminal 1, the ground terminal 2 and the annular ground electrode 6 by the screen printing method. The through conductor 9 was formed by filling Ag-base conductor paste formed to have a diameter of 100 μm by mold stamping.

Next, as shown in FIG. 5, the bottom face of the surface acoustic wave device was arranged as opposed to the top face of the base substrate 5 so that the first signal pad 15, the second signal pad 16, the ground pad 8 and the annular ground conductor 7 of the base substrate 5 might correspond to the positions of the signal terminals 1a and 1b, the ground terminal 2 and the annular ground electrode 6 of the piezoelectric substrate 17, respectively, and the piezoelectric substrate 17 and the base substrate 5 were subjected to reflow melting in a reflow oven at 240° C. for 5 minutes and joined to each other through the joint layer 20 formed of solder.

At this time, by joining the annular ground electrode 6 to the annular ground conductor 7 through the joint layer 20, the first IDT electrode 3 and the second IDT electrode 4 were hermetically sealed. After applying the sealing resin 21 made of epoxy resin on the piezoelectric substrate 17 by the potting method so as to cover the surface acoustic wave device on the base substrate 5, it was heated and hardened in a drying furnace at 150° C. for 5 minutes to produce the surface acoustic wave apparatus.

Figure 10:
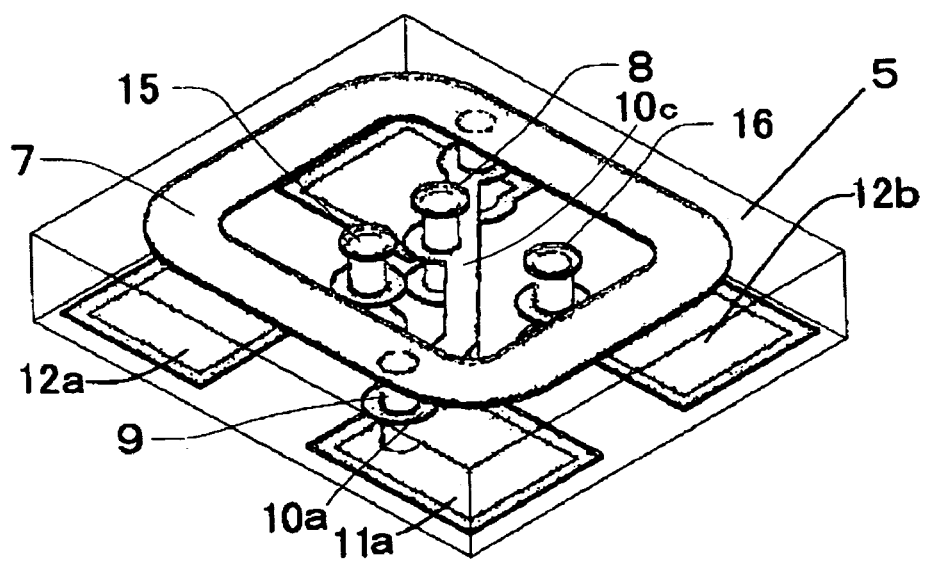
FIG. 10 is a perspective view showing the configuration of the base substrate of a surface acoustic wave apparatus in a reference example.

FIG. 10 is a perspective view of the base substrate 5 of a surface acoustic wave apparatus in a reference example.

As a reference example, the surface acoustic wave apparatus shown in FIG. 10 in which the first ground conductor and the second ground conductor are connected to each other through the internal ground conductor layer 10c was produced using the same materials as the above-mentioned materials by the same process.

Next, the characteristics of the surface acoustic wave apparatuses in the first example and the reference example were measured. Measurement was performed under the condition of an input of a signal of 0 dBm, 780 MHz to 960 MHz and 800 measurement points. The number of samples was 30 and Multi-port Network Analyzer E5071A manufactured by Agilent Technologies was used as measurement equipment.

Figure 11:
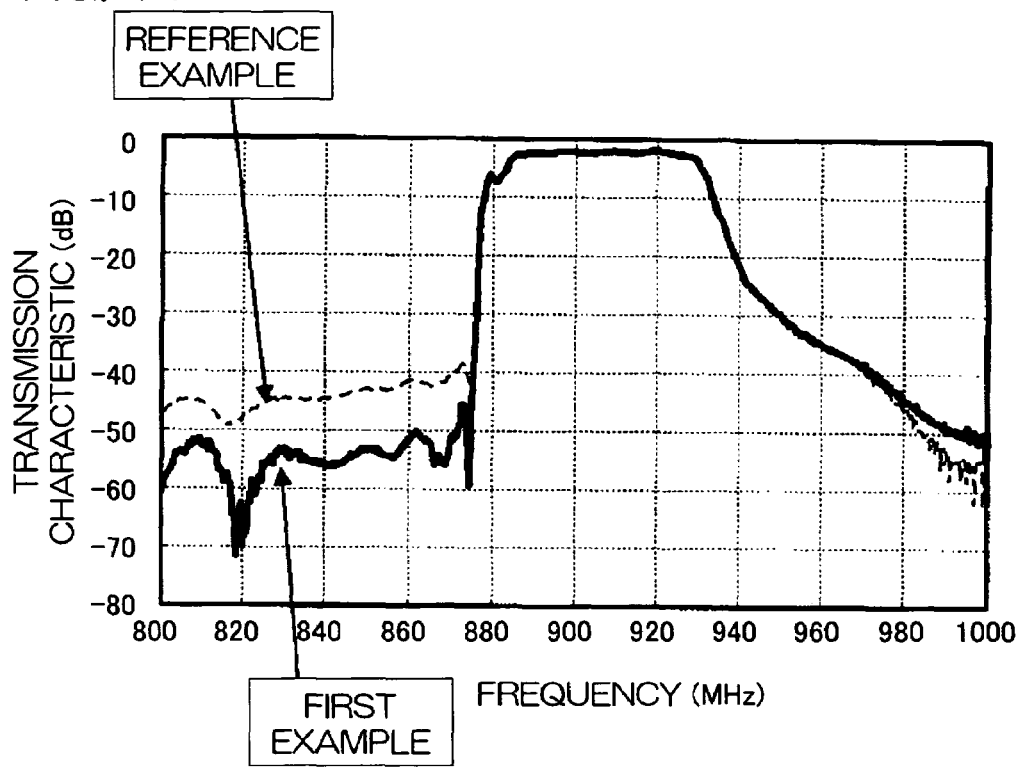
FIG. 11 is a diagram showing the frequency characteristic of insertion loss in a pass band and its vicinity of the surface acoustic wave apparatus.
Figure 12:
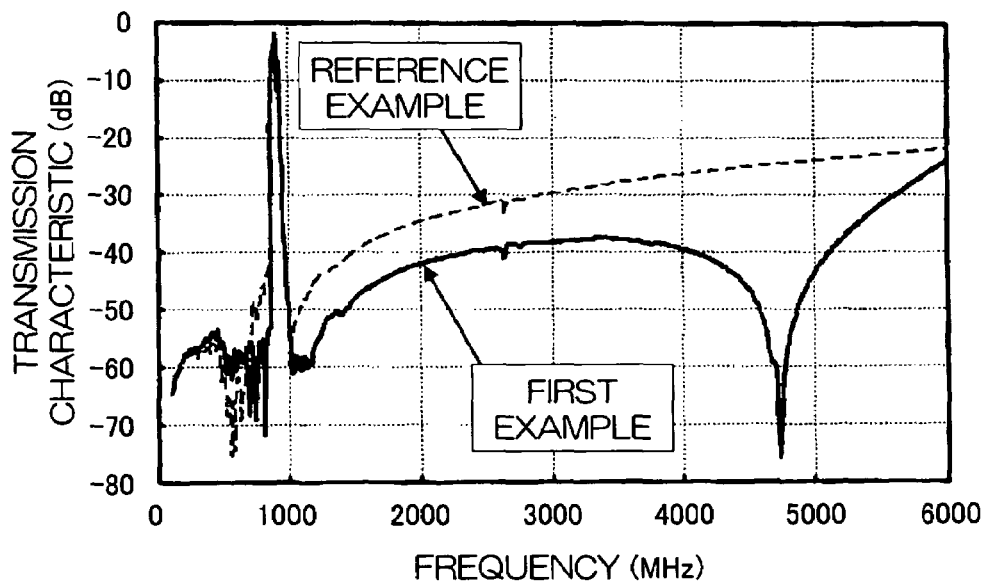
FIG. 12 is a diagram showing the frequency characteristic for comparing the out-of-band attenuation characteristic of the surface acoustic wave apparatus.

FIG. 11 and FIG. 12 are diagrams showing frequency dependence of the transmission characteristic of the input signal of the surface acoustic wave apparatus in the first example and the surface acoustic wave apparatus in the reference example. In FIGS. 11 and 12, a horizontal axis represents frequency (MHz) and a vertical axis represents transmission characteristic (dB).

Here, FIG. 11 is a diagram showing frequency dependence of insertion loss representing the transmission characteristic near the pass band. FIG. 12 is a diagram showing the transmission characteristic for contrasting the out-of-band attenuation characteristic especially at the side of high frequency.

In FIG. 11 and FIG. 12, the transmission characteristic of the surface acoustic wave apparatus in the first example was indicated by a solid line and the transmission characteristic of the surface acoustic wave apparatus in the reference example was indicated by a broken line.

As apparent from FIG. 11 and FIG. 12, the attenuation pole was generated at the side of high frequency outside the pass band according to the surface acoustic wave apparatus in the first example and the out-of-band attenuation characteristic was greatly improved as compared to the reference example. Thus, it turned out that the filter characteristic of the first example in which the first ground conductor was electrically separated from the second ground conductor was suitable.

SECOND EXAMPLE

Figure 13:
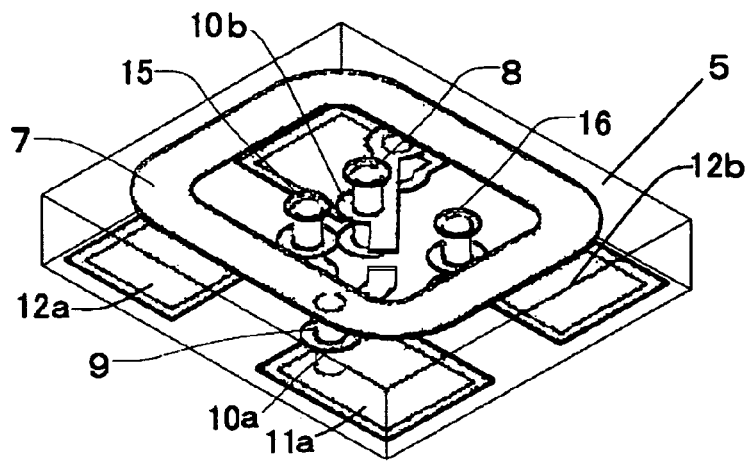
FIG. 13 is a perspective view showing the configuration of the base substrate of a surface acoustic wave apparatus in a second example.

As a second example, the surface acoustic wave apparatus shown in FIG. 13, in which the number of the through conductors 9 was smaller and area of the internal ground conductor layers 10a and 10b was smaller as compared to the surface acoustic wave apparatus in the first example, was produced using the same materials as the first example by the same process.

FIG. 13 is a perspective view of the configuration of the base substrate of a surface acoustic wave apparatus in the second example.

The characteristic of the surface acoustic wave apparatus in the second example was measured. Measurement was performed under the condition of an input of a signal of 0 dBm, 780 MHz to 960 MHz and 800 measurement points. The number of samples was 30 and Multi-port Network Analyzer E5071A manufactured by Agilent Technologies was used as measurement equipment.

Figure 14:
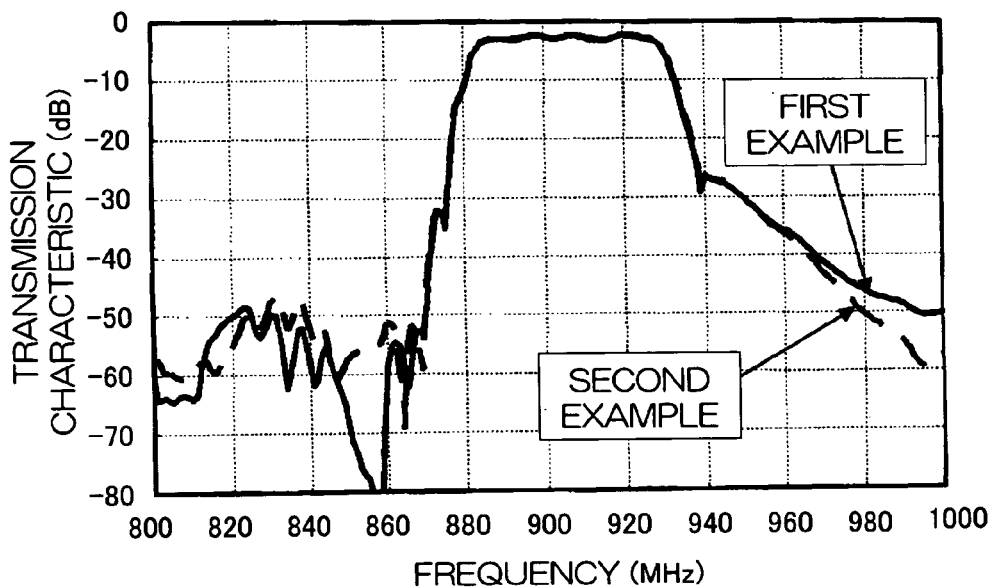
FIG. 14 is a diagram showing the frequency characteristic of insertion loss in a pass band and its vicinity of the surface acoustic wave apparatus.
Figure 15:
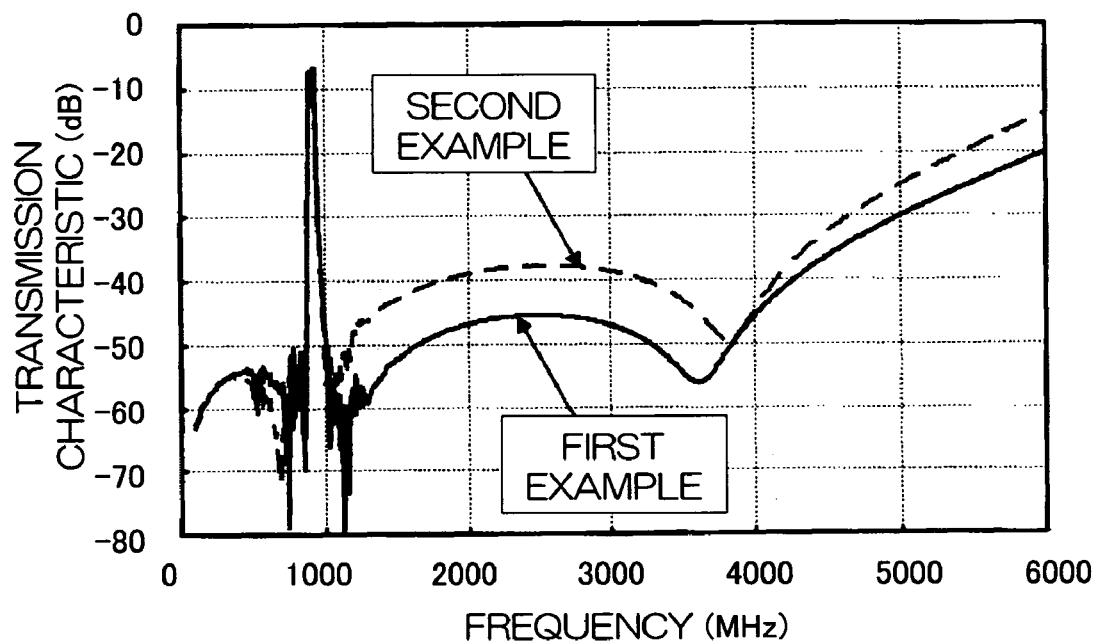
FIG. 15 is a diagram showing the frequency characteristic for comparing the out-of-band attenuation characteristic of the surface acoustic wave apparatus.
Figure 16:
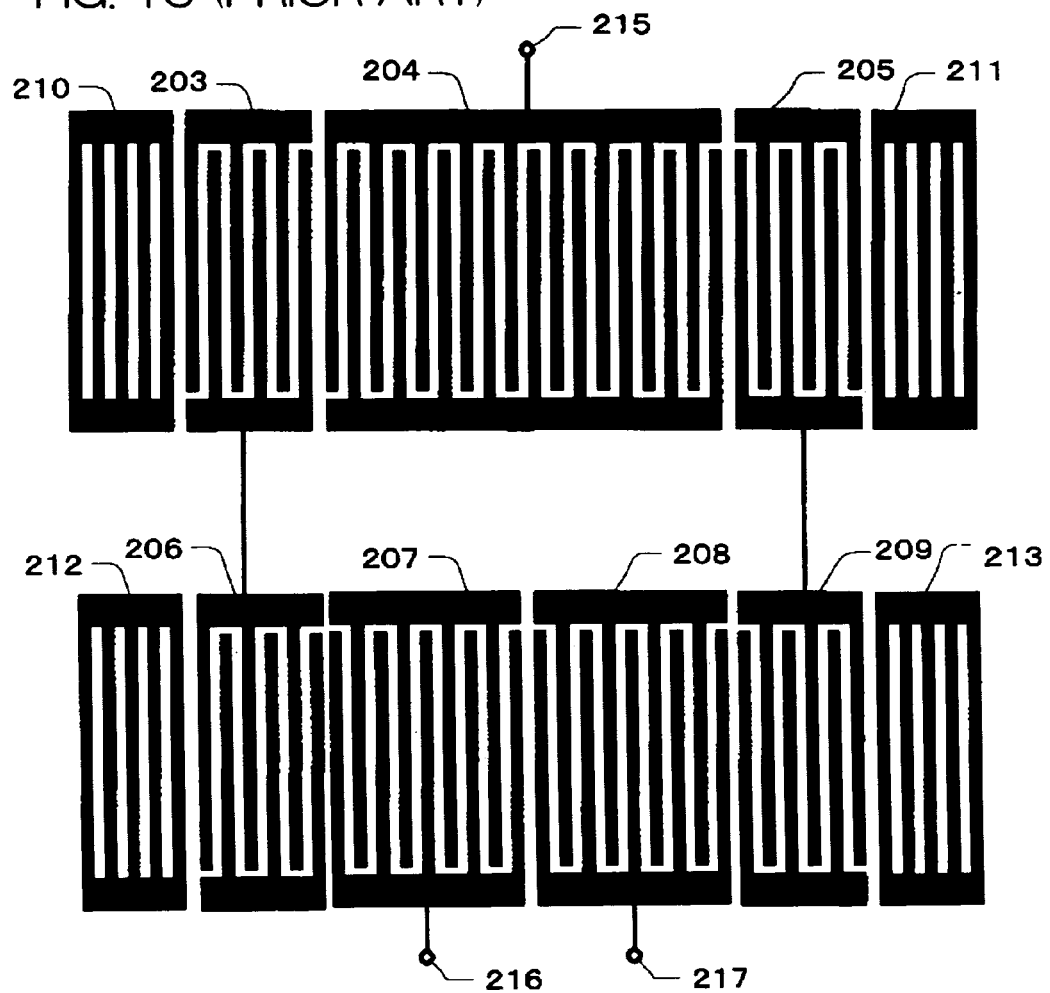
FIG. 16 is a schematic plan view showing the configuration of electrodes of a conventional surface acoustic wave apparatus.
Figure 17:
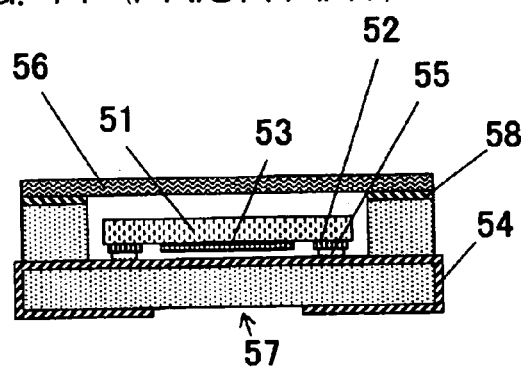
FIG. 17 is a schematic sectional view showing a conventional CSP type surface acoustic wave apparatus.

FIG. 14 and FIG. 15 are diagrams showing frequency dependence of the transmission characteristic of the input signal in the surface acoustic wave apparatus in the first example and the surface acoustic wave apparatus in the second example.

In FIG. 14 and FIG. 15, a horizontal axis represents frequency (MHz) and a vertical axis represents transmission characteristic (dB).

Here, FIG. 14 is a diagram showing frequency dependence of insertion loss representing the transmission characteristic near the pass band. FIG. 15 is a diagram showing the transmission characteristic for contrasting the out-of-band attenuation characteristic especially at the side of high frequency.

In FIG. 14 and FIG. 15, the transmission characteristic of the surface acoustic wave apparatus in the first example was indicated by a solid line and the transmission characteristic of the surface acoustic wave apparatus in the second example was indicated by a broken line.

As apparent from FIG. 14 and FIG. 15, although the attenuation pole was generated at the side of high frequency outside the pass band and thus the out-of-band attenuation characteristic was improved according to the surface acoustic wave apparatus of the first example, it turned out that the surface acoustic wave apparatus in the first example is superior to the surface acoustic wave apparatus in the second example in the out-of-band attenuation characteristic.

The reason is as follows: since the area in which the annular ground conductor 7 was opposed to the internal ground conductor 10a and the area in which the internal ground conductor 10a was opposed to the bottom face ground conductor layer 11a in the first example were larger than those in the second example, large capacity components were generated between each of the conductors 7, 10a, 10b, 11a and 11b, thereby also causing a large capacity component (capacity component C3 shown in FIG. 9) between the first ground conductor and the second ground conductor. The position of the attenuation pole could be controlled at the side of low frequency closer to the pass band by the resonator circuit of these capacity components and the inductance components of the first ground conductor and the second ground conductor (inductances L1, L2 shown in FIG. 9). Thus, it was guessed that the out-of-band attenuation characteristic was improved for this reason.

The invention claimed is:

1. A surface acoustic wave apparatus comprising:
a piezoelectric substrate on the bottom face of which a first IDT electrode, a second IDT electrode, a ground terminal of the second IDT electrode and an annular ground electrode which encloses the first electrode and the second electrode and is connected to the first IDT electrode to function as a ground terminal of the first IDT electrode are formed; and
a base substrate on the top face of which an annular ground conductor corresponding to the annular ground electrode and a ground pad corresponding to the ground terminal of the second IDT electrode are formed, for mounting the piezoelectric substrate thereon so as to be opposed to the face of the piezoelectric substrate on which the IDT electrodes and the like are formed, wherein
the annular ground conductor of the base substrate is connected to a first ground conductor which is composed of at least a first bottom face ground conductor layer that is provided on the bottom face of the base substrate,
the ground pad of the base substrate is connected to a second ground conductor which is composed of at least a second bottom face ground conductor layer that is provided on the bottom face of the base substrate, and
the first ground conductor is electrically separated from the second ground conductor.

2. A surface acoustic wave apparatus of claim 1, wherein the base substrate is a multilayer substrate, and the first ground conductor comprises a first internal ground conductor layer, and wherein a part of the annular ground conductor, the first internal ground conductor layer and the first bottom face ground conductor layer are arranged to be opposed to each other.

3. A surface acoustic wave apparatus of claim 1, wherein the base substrate is a multilayer substrate, and the second ground conductor comprises a second internal ground conductor layer, and wherein the second internal ground conductor layer and the second bottom face ground conductor layer are arranged so as to be opposed to each other.

4. A surface acoustic wave apparatus of claim 1, wherein the base substrate has four or more corner portions viewed in a plan view and the first bottom face ground conductor layer is provided at one of two corner portions which are not adjacent to each other and the second bottom face ground conductor layer is provided at the other of the two corner portions which are not adjacent to each other.

5. A surface acoustic wave apparatus Comprising:
a piezoelectric substrate on the bottom face of which a first IDT electrode, a second IDT electrode, a ground terminal of the second IDT electrode and an annular ground electrode which encloses the first electrode and the second electrode and is connected to the first IDT electrode to function as a ground terminal of the first IDT electrode are formed; and
a base substrate on the top face of which an annular ground conductor corresponding to the annular ground electrode and a ground pad corresponding to the ground terminal of the second IDT electrode are formed, for mounting the piezoelectric substrate thereon so as to be opposed to the face of the piezoelectric substrate on which the IDT electrodes and the like are formed, wherein
the annular ground conductor of the base substrate is connected to a first ground conductor which is composed of at least a first bottom face ground conductor layer that is provided on the bottom face of the base substrate,
the ground pad of the base substrate is connected to a second ground conductor which is composed of at least a second bottom face ground conductor layer that is provided on the bottom face of the base substrate, and
the first ground conductor is electrically separated from the second ground conductor,
wherein the base substrate is a multilayer substrate, and the first ground conductor comprises a first internal ground conductor layer, and wherein a part of the annular ground conductor, the first internal ground conductor layer and the first bottom face ground conductor layer are arranged to be opposed to each other,
wherein the signal terminal of the first IDT electrode and the signal terminal of the second IDT electrode are led to the bottom face of the base substrate through a first signal conductor and a second signal conductor formed on the base substrate, respectively, and the first internal ground conductor layer is arranged between the first signal conductor and the second signal conductor.

6. A surface acoustic wave apparatus comprising:
a piezoelectric substrate on the bottom face of which a first IDT electrode, a second IDT electrode, a ground terminal of the second IDT electrode and an annular ground electrode which encloses the first electrode and the second electrode and is connected to the first IDT electrode to function as a ground terminal of the first IDT electrode are formed; and
a base substrate on the top face of which an annular ground conductor corresponding to the annular ground electrode and a ground pad corresponding to the ground terminal of the second IDT electrode are formed, for mounting the piezoelectric substrate thereon so as to be opposed to the face of the piezoelectric substrate on which the IDT electrodes and the like are formed, wherein
the annular ground conductor of the base substrate is connected to a first ground conductor which is composed of at least a first bottom face ground conductor layer that is provided on the bottom face of the base substrate,
the ground pad of the base substrate is connected to a second ground conductor which is composed of at least a second bottom face ground conductor layer that is provided on the bottom face of the base substrate, and
the first ground conductor is electrically separated from the second ground conductor,
wherein the base substrate is a multilayer substrate, and the second ground conductor comprises a second internal ground conductor layer, and wherein the second internal ground conductor layer and the second bottom face ground conductor layer are arranged so as to be opposed to each other,
wherein the signal terminal of the first IDT electrode and the signal terminal of the second IDT electrode are led to the bottom face of the base substrate through a first signal conductor and a second signal conductor formed on the base substrate, respectively, and the second internal ground conductor layer is arranged between the first signal conductor and the second signal conductor.

7. A surface acoustic wave apparatus comprising:

a piezoelectric substrate on the bottom face of which a first IDT electrode, a second IDT electrode, a ground terminal of the second IDT electrode and an annular ground electrode which encloses the first electrode and the second electrode and functions as a ground terminal of the first IDT electrode are formed; and a multilayer base substrate on the top face of which an annular ground conductor corresponding to the annular ground electrode and a ground pad corresponding to the ground terminal of the second IDT electrode are formed, for mounting the piezoelectric substrate thereon so as to be opposed to the face of the piezoelectric substrate on which the IDT electrodes and the like are formed, wherein the annular ground conductor of the base substrate is connected to a first ground conductor which is composed of a first internal ground conductor layer and a first bottom face ground conductor layer of the base substrate, the annular ground conductor is connected to the first internal ground conductor layer via a through conductor and the first internal ground conductor layer is connected to the first bottom face ground conductor layer via the through conductor, the ground pad of the base substrate is connected to a second ground conductor which is composed of at least a second bottom face ground conductor layer of the base substrate, and the first ground conductor is electrically separated from the second ground conductor.

8. A surface acoustic wave apparatus comprising:

a piezoelectric substrate on the bottom face of which a first IDT electrode, a second IDT electrode, a ground terminal of the second IDT electrode and an annular ground electrode which encloses the first electrode and the second electrode and is connected to the first IDT electrode to function as a ground terminal of the first IDT electrode are formed; and a base substrate on the top face of which an annular ground conductor corresponding to the annular ground electrode and a ground pad corresponding to the ground terminal of the second IDT electrode are formed, for mounting the piezoelectric substrate thereon so as to be opposed to the face of the piezoelectric substrate on which the IDT electrodes and the like are formed, wherein the annular ground conductor of the base substrate is connected to a first ground conductor which is composed of at least a first bottom face ground conductor layer that is provided on the bottom face of the base substrate, the ground pad of the base substrate is connected to a second ground conductor which is composed of at least a second bottom face ground conductor layer that is provided on the bottom face of the base substrate, and the first ground conductor is electrically separated from the second ground conductor, wherein the base substrate is a multilayer substrate, and the second ground conductor comprises a second internal ground conductor layer, and the ground pad formed on the top face of the base substrate is connected to the second internal ground conductor layer via a through conductor and the second internal ground conductor layer is connected to the second bottom face ground conductor layer via the through conductor.

9. A surface acoustic wave apparatus of claim 7, wherein the second ground conductor comprises a second internal ground conductor layer, the ground pad formed in the top face of the base substrate is connected to the second internal ground conductor layer via a through conductor and the second internal ground conductor layer is connected to the second bottom face ground conductor layer via the through conductor.

10. A surface acoustic wave apparatus of claim 7, wherein the signal terminal of the first IDT electrode and the signal terminal of the second IDT electrode are led to the bottom face of the base substrate through a first signal conductor and a second signal conductor formed on the base substrate, respectively, and the first internal ground conductor layer is arranged between the first signal conductor and the second signal conductor.

11. A surface acoustic wave apparatus of claim 8, wherein the signal terminal of the first IDT electrode and the signal terminal of the second IDT electrode are led to the bottom face of the base substrate through a first signal conductor and a second signal conductor formed on the base substrate, respectively, and the second internal ground conductor layer is arranged between the first signal conductor and the second signal conductor.

12. A surface acoustic wave apparatus of claim 10, wherein the second ground conductor comprises a second internal ground conductor layer, the signal terminal of the first IDT electrode and the signal terminal of the second IDT electrode are led to the bottom face of the base substrate through a first signal conductor and a second signal conductor formed on the base substrate, respectively, and the first internal ground conductor layer and the second internal ground conductor layer each are arranged between the first signal conductor and the second signal conductor.

13. A communications equipment comprising a receiving circuit using the surface acoustic wave apparatus of claim 1 as a filter circuit component.

14. A communications equipment comprising a transmitting circuit using the surface acoustic wave apparatus of claim 1 as a filter circuit component.

* * * * *